(12) United States Patent
Atkinson

(10) Patent No.: US 7,161,808 B2
(45) Date of Patent: Jan. 9, 2007

(54) RETAINING HEAT SINKS ON PRINTED CIRCUIT BOARDS

(75) Inventor: Robert R. Atkinson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 10/804,413

(22) Filed: Mar. 19, 2004

(65) Prior Publication Data

US 2005/0207123 A1    Sep. 22, 2005

(51) Int. Cl.
*H05K 7/20* (2006.01)

(52) U.S. Cl. ............... 361/719; 361/710; 361/718; 24/457; 24/458; 411/508; 257/719

(58) Field of Classification Search ........ 361/719–720, 361/710, 715, 717, 722; 411/508; 257/718, 257/719; 24/457–458
See application file for complete search history.

(56) References Cited

U.S. PATENT DOCUMENTS

| | | | | |
|---|---|---|---|---|
| 3,220,078 A | * | 11/1965 | Preziosi | 411/349 |
| 4,007,516 A | * | 2/1977 | Coules | 411/349 |
| 4,047,266 A | * | 9/1977 | Bisbing | 411/349 |
| 4,898,493 A | * | 2/1990 | Blankenburg | 403/326 |
| 4,969,065 A | * | 11/1990 | Petri | 361/804 |
| 5,586,005 A | * | 12/1996 | Cipolla et al. | 361/719 |
| 5,901,039 A | * | 5/1999 | Dehaine et al. | 361/704 |
| 6,104,614 A | * | 8/2000 | Chou et al. | 361/704 |
| 6,307,748 B1 | * | 10/2001 | Lin et al. | 361/704 |
| 6,412,546 B1 | * | 7/2002 | Lin et al. | 165/80.3 |
| 6,456,490 B1 | * | 9/2002 | Lai | 361/684 |
| 6,480,387 B1 | * | 11/2002 | Lee et al. | 361/704 |
| 6,501,658 B1 | * | 12/2002 | Pearson et al. | 361/709 |
| 6,611,431 B1 | * | 8/2003 | Lee et al. | 361/719 |
| 6,752,577 B1 | * | 6/2004 | Chen et al. | 411/508 |
| 6,866,455 B1 | * | 3/2005 | Hasler | 411/21 |
| 6,866,540 B1 | * | 3/2005 | Robertson | 439/488 |
| 6,874,983 B1 | * | 4/2005 | Moerke et al. | 411/46 |
| 6,934,155 B1 | * | 8/2005 | Aoki et al. | 361/704 |
| 2003/0184948 A1 | * | 10/2003 | Settergren et al. | 361/301.3 |
| 2004/0047130 A1 | * | 3/2004 | Liu | 361/704 |
| 2004/0052611 A1 | * | 3/2004 | Liu | 411/508 |
| 2005/0117305 A1 | * | 6/2005 | Ulen et al. | 361/719 |

* cited by examiner

*Primary Examiner*—Michael Datskovsky
*Assistant Examiner*—Robert J. Hoffberg
(74) *Attorney, Agent, or Firm*—Trop, Pruner & Hu, P.C.

(57) ABSTRACT

A heat sink assembly may be plugged into a receiving element in a printed circuit board. A retention element includes upper and lower portions. The lower portion may be plug locked onto a printed circuit board. The upper portion then telescopes into and releaseably locks in the lower portion. The upper portion may include a rod which may be rotated to free the upper portion from the lower portion for disassembly.

21 Claims, 7 Drawing Sheets

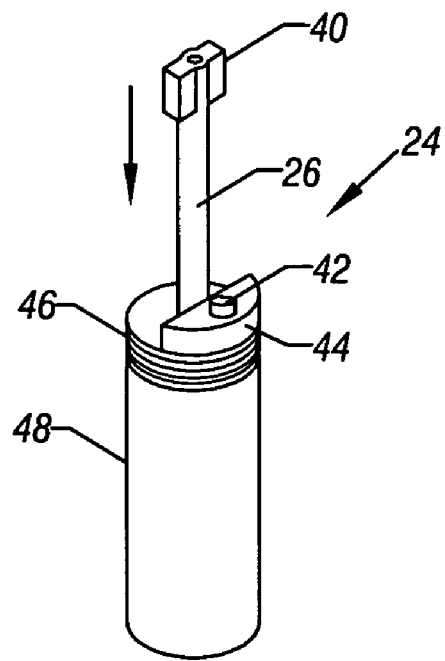
FIG. 5
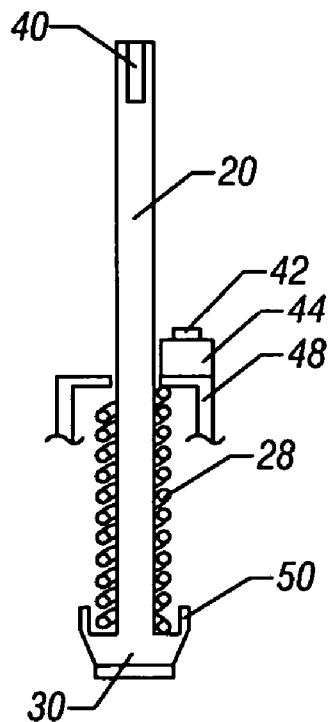 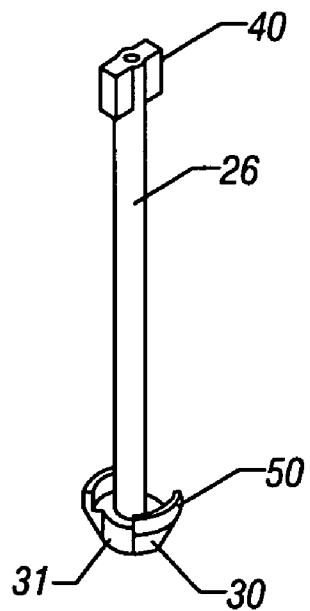
FIG. 6      FIG. 7

RETAINING HEAT SINKS ON PRINTED CIRCUIT BOARDS

BACKGROUND

This invention relates generally to securing heat sinks over electronic devices to be cooled on printed circuit boards.

Printed circuit boards, such as motherboards, may include a number of electronic components. These electric components may produce heat which needs to be dissipated through a heat sink.

Generally, the printed circuit board is attached to a chassis with the electronic components already in place on the printed circuit board. Then the heat sink is attached over the component to be cooled. Conventionally, four bolts are used at each of the corners of the heat sink base to secure the heat sink onto the printed circuit board.

There may be a number of issues with this approach. For example, tightening the bolts may be a time consuming process. Accessing the bolts past the heat sink fins may be awkward and difficult. The protruding bolts may tend to interfere with the flow of cooling fluid across the heat sink. Other issues may also exist.

Thus, there is a need for better ways to secure heat sinks over components to be cooled on printed circuit boards.

BRIEF DESCRIPTION OF THE DRAWINGS

FIG. 5 is a perspective view of a heat sink side assembly in accordance with one embodiment of the present invention;

FIG. 6 is a cut-away view of the heat sink side assembly, shown in FIG. 5, in accordance with one embodiment of the present invention;

FIG. 7 is a perspective view of an assembly rod utilized in the heat sink side assembly in accordance with one embodiment of the present invention;

DETAILED DESCRIPTION

Figure 1:
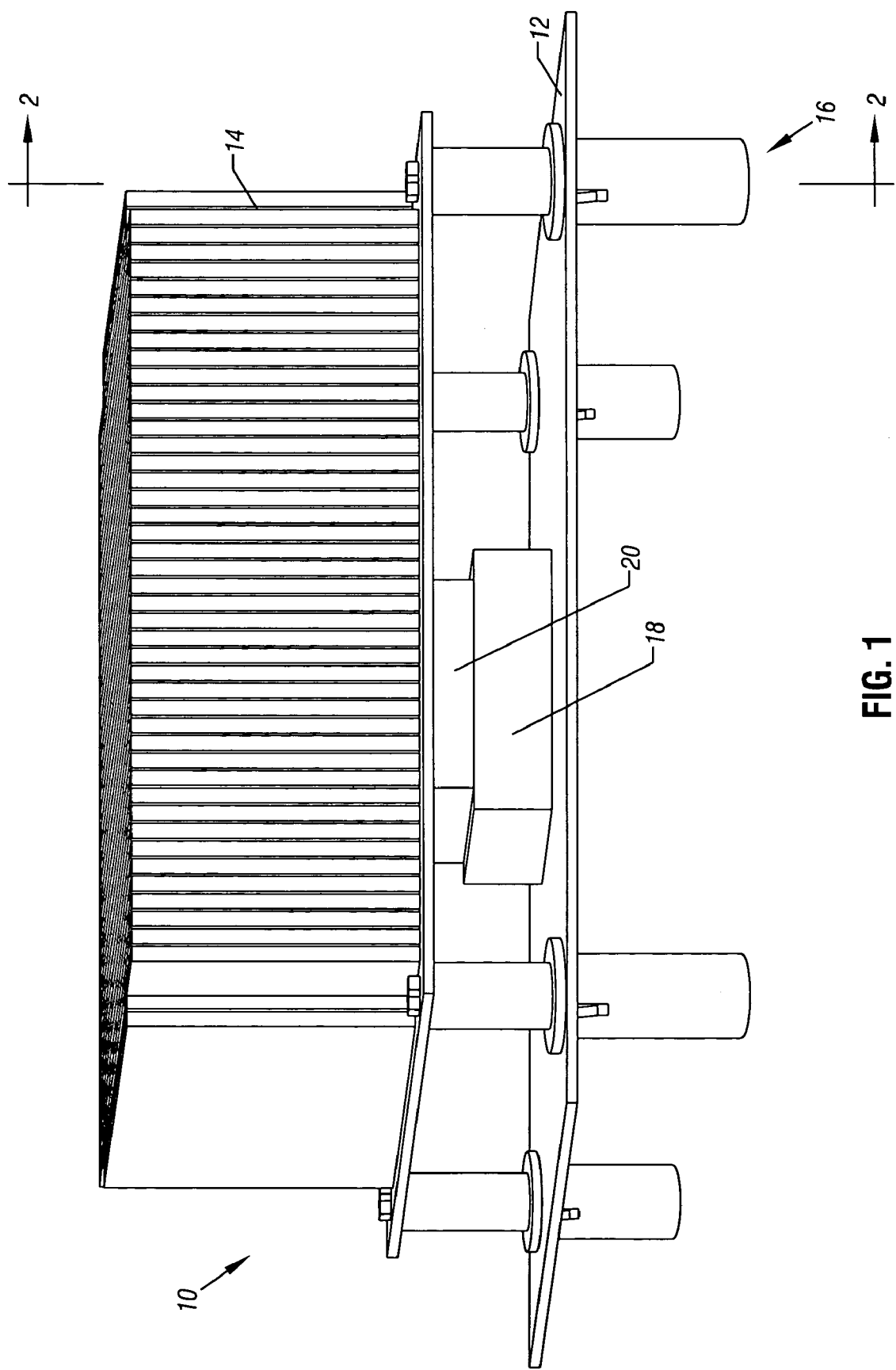
FIG. 1 is a side elevational view of one embodiment of the present invention.

Referring to FIG. 1, a heat sink 14 may be secured to a printed circuit board 12 to produce a circuit board assembly 10. The heat sink 14 may be any type of heat sink, including those which include a plurality of upstanding fins. The heat sink 14 may be secured over an integrated circuit 20, such as a processor, and a socket body 18, secured to the printed circuit board 12. At corners of the heat sink 14 are provided a heat sink retention element 16.

Figure 2:
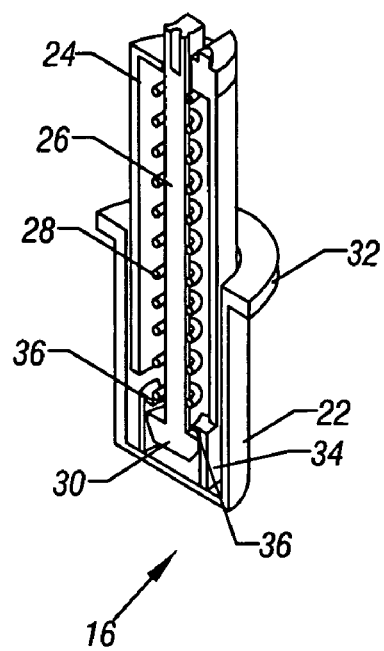
FIG. 2 is a vertical cross-section taken generally along the line 2—2 in FIG. 1.

Referring to FIG. 2, the heat sink retention element 16 may include two portions, including a telescoping upper portion 24 and a lower portion 22. The upper portion 24 includes an assembly rod 26 that extends through the upper portion 24, biased by a spring 28. The lower end of the rod 26 includes the rod base 30, which extends transversely to the length of the rod 26.

Figure 3:
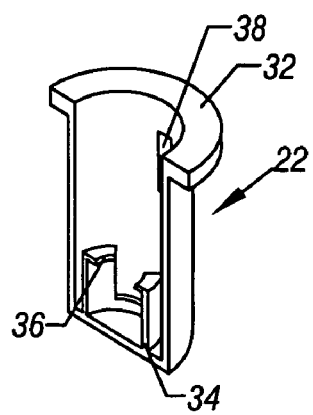
FIG. 3 is a vertical cross-section through a portion of the device, shown in FIG. 2, in accordance with one embodiment of the present invention.

As shown in FIG. 3, the lower portion 22 may include a flanged upper surface 32 arranged to be situated over the printed circuit board 12. A spring-loaded clip 38 secures the lower portion 22 in a locked position on the printed circuit board 12. At the bottom of the cup-shaped lower portion 22 is an upstanding catch 32, having an L-shaped free end 36 to define the catch.

Figure 4:
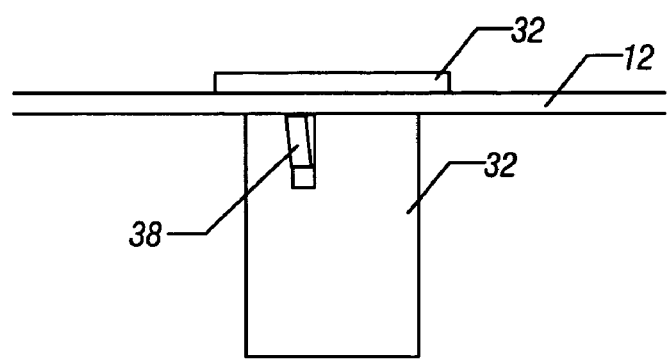
FIG. 4 is a side elevational view of a sleeve in place on a printed circuit board in accordance with one embodiment of the present invention.

As shown in FIG. 4, the spring-loaded clip 38 is angled inwardly as it extends downwardly so that, as its lower portion passes through an opening in the printed circuit board 12, the spring-loaded clip 38 deflects inwardly into the lower portion 22 and then, after passing the printed circuit board 12, springs outwardly. Thus, as shown in FIG. 4, the upper end of the clip 38 and the flange 32 lock the lower portion 22 to the printed circuit board 12. This assembly may be tool-less in that all that is needed, in one embodiment, is to simply insert the lower portion 22 into an appropriate opening in the printed circuit board 12.

Moving to FIG. 5, the upper portion 24 may include a sleeve 48 having a threaded region 46 at its upper end. Over the threaded region 46 is a block 44 which may be a section of a circular shape, matching the upper surface of the upper portion 24. The block 44 is secured to the sleeve 48 by a bolt 42. The rod 26, at this stage, extends upwardly, having an operator 40 which extends transversely away from the rod 26 in two opposed directions.

As shown in FIG. 6, the rod 26 is attached to the rod base 30, which has an upstanding ring 50 to retain a spring 28 between the base 50 and the upper portion of the sleeve 48. As better shown in FIG. 7, the base 30 includes a cut-out region 31 that is useful in the disassembly process, explained later.

Figure 8:
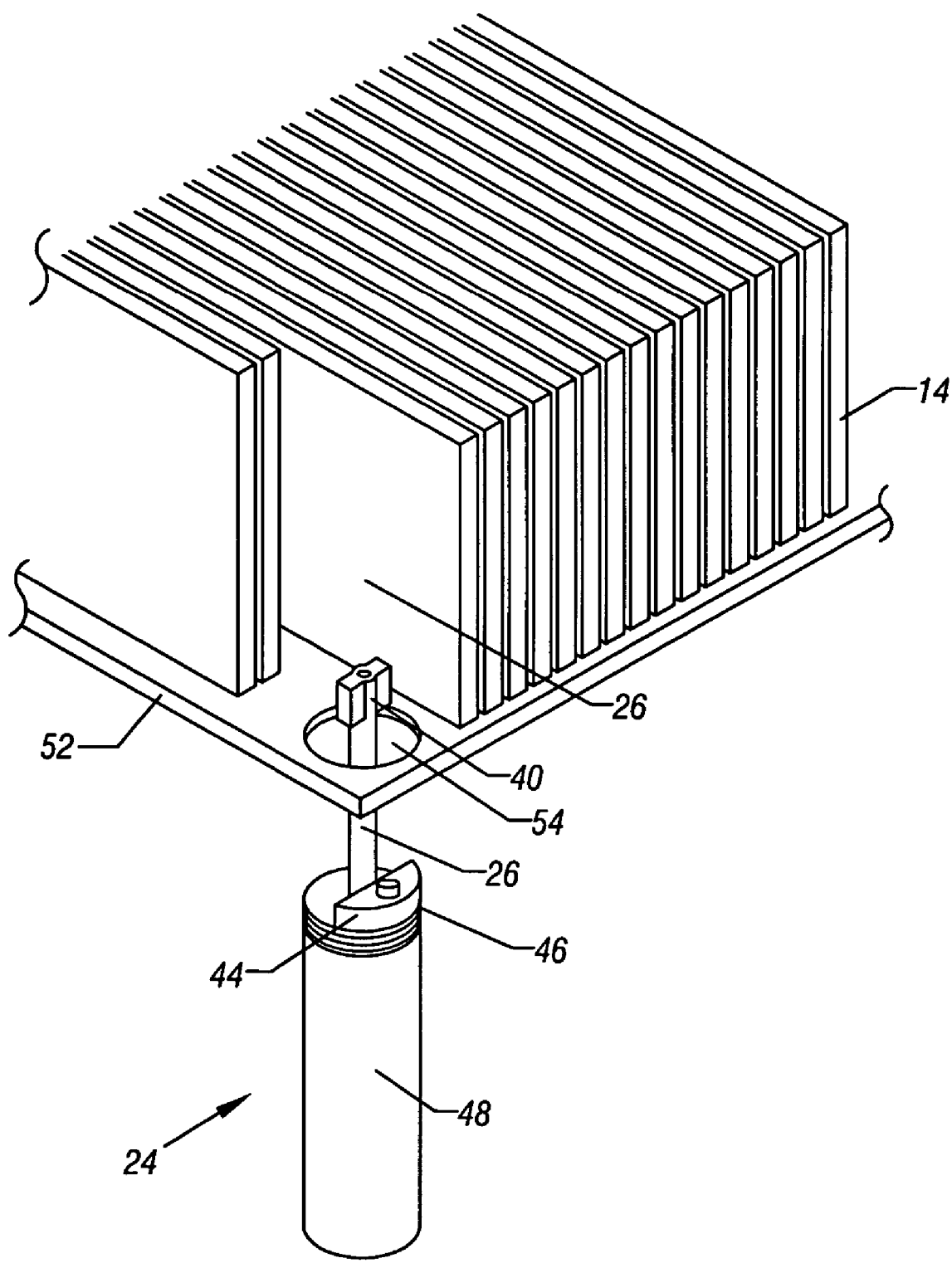
FIG. 8 is a perspective view of one embodiment of the present invention being installed on a heat sink.
Figure 9:
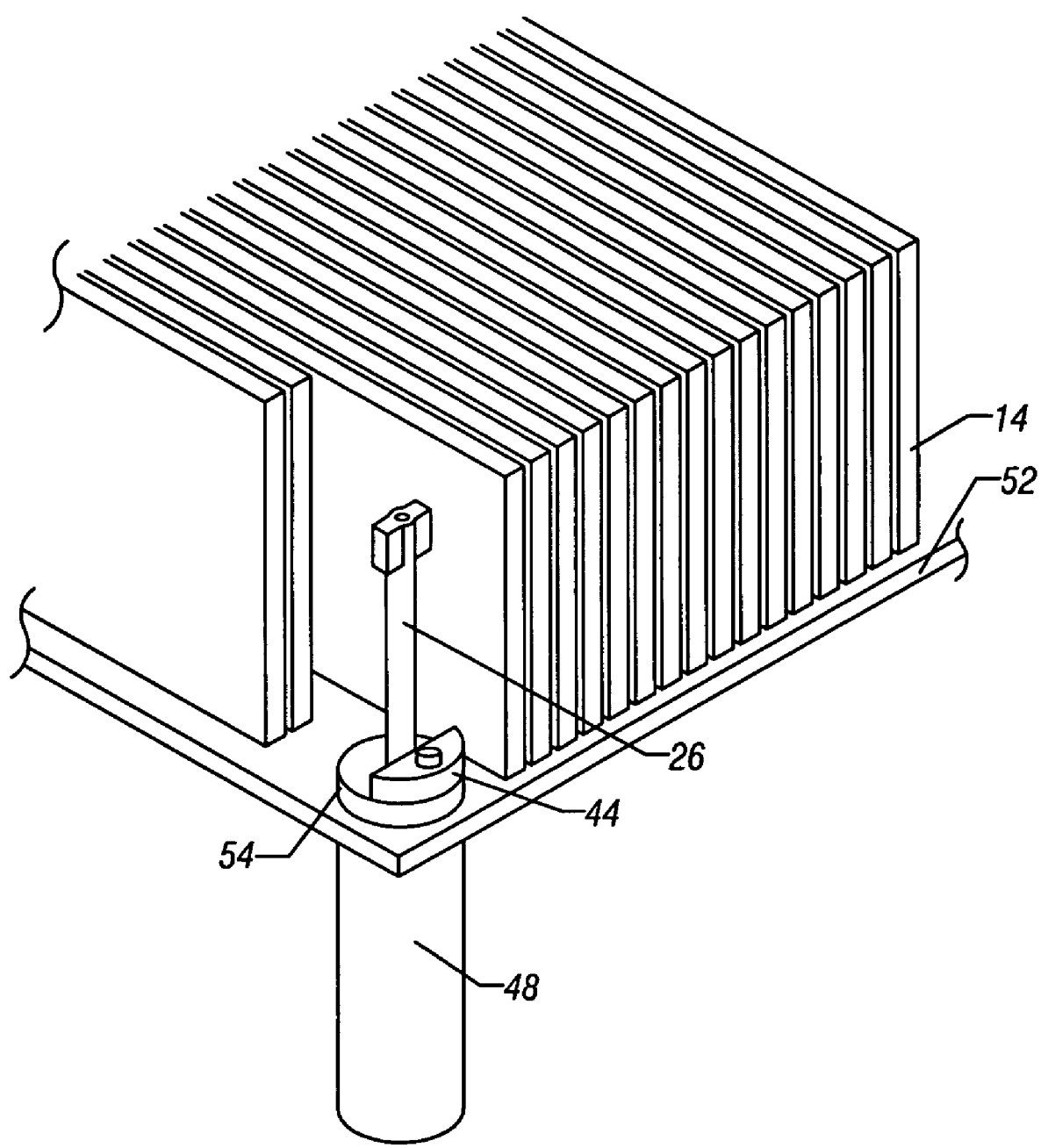
FIG. 9 is a view corresponding to FIG. 8 after the retention assembly has partially engaged the heat sink in accordance with one embodiment of the present invention.

The assembly of the heat sink 14 to the upper portion 24 is shown in FIG. 8. The free end of the rod 26, containing the operator 40, is passed through an aperture 54 in the base 52 of the heat sink 14. Then the threaded region 46 is threaded into the base 52 at the opening 54, as shown in FIG. 9.

Figure 10:
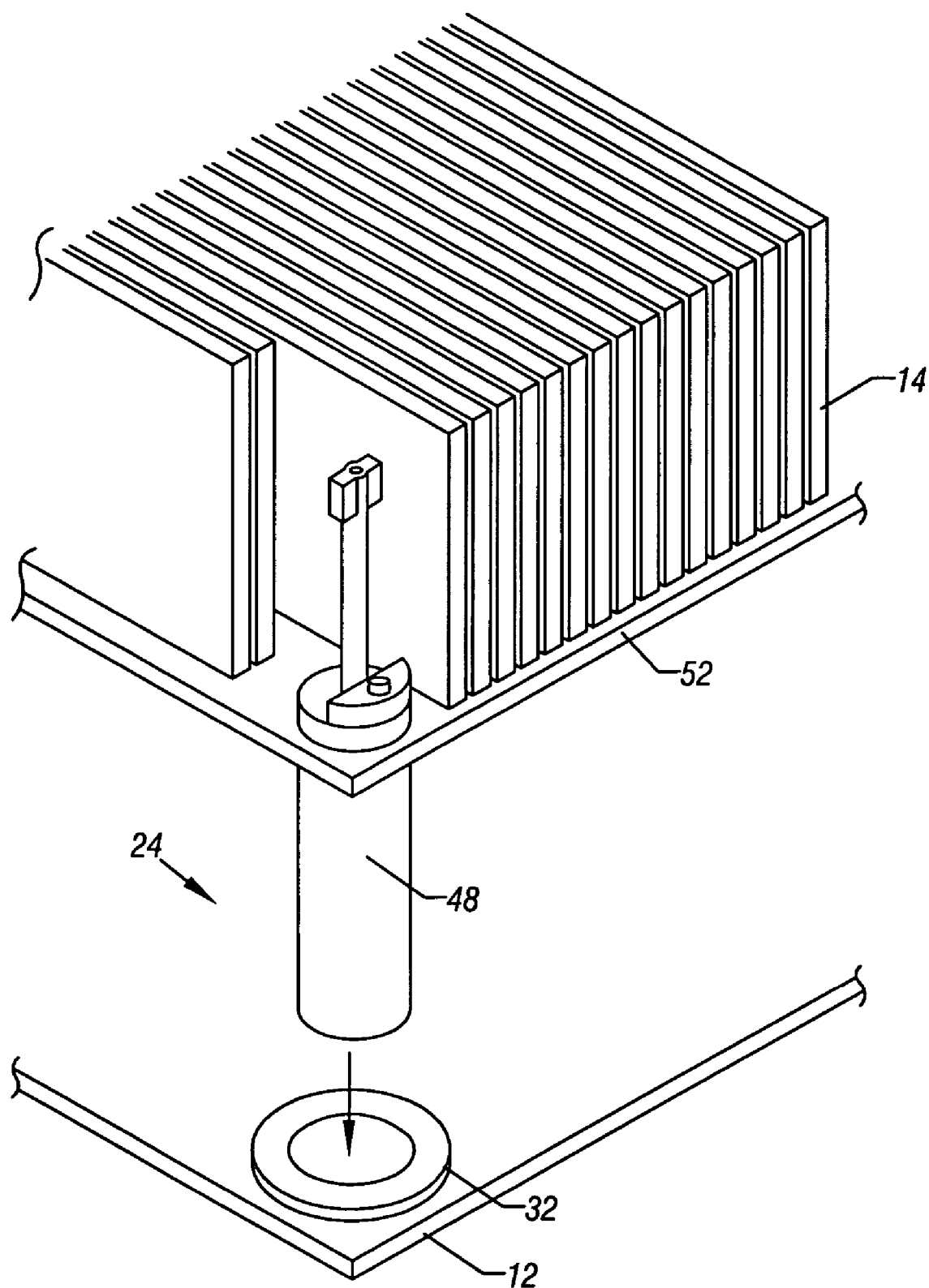
FIG. 10 is a perspective view showing the securement of the heat sink assembly to a printed circuit board in accordance with one embodiment of the present invention.

Next, the upper portion 24 is engaged into the lower portion 22 which has already been secured to the printed circuit board 12 as illustrated in FIG. 4. The upper portion 24 telescopes into the opening defined in the top of the lower portion 22, as shown in FIG. 10.

Figure 11:
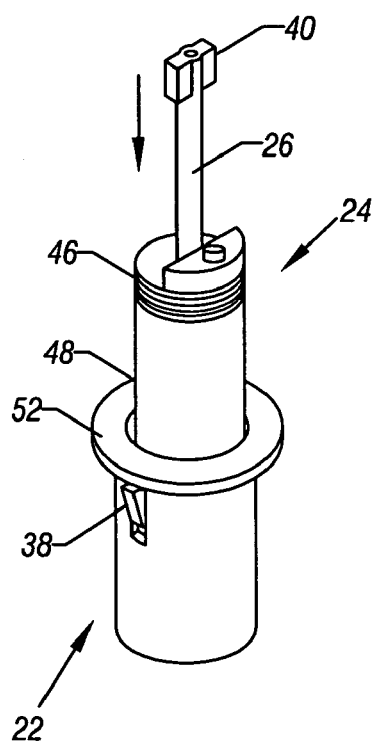
FIG. 11 is an enlarged perspective view illustrating the securement of the retention assembly to secure the heat sink over an integrated circuit to be cooled in accordance with one embodiment of the present invention.

Then, as shown in FIG. 11, the upper portion 24 is pushed down into the lower portion 22 using the operator 40 in one embodiment. Eventually, the operator 40 drives the rod 26 so that its base 30 engages and locks in the catch 34 in the lower portion 22, as shown in FIG. 2. In particular, the base 30 has downwardly tapering edges in the flange 50, which spread the L-shaped arms 36 of the catch 34, allowing the rod base 30 to pass, and then become releasably locked within, the catch 34.

Thus, the assembly 10 can be secured together without the need for rotating bolts in some embodiments. In addition, a low profile may be achieved that does not interfere with the flow of fluid through the heat sink 14 in some embodiments of the present invention.

Figure 12:
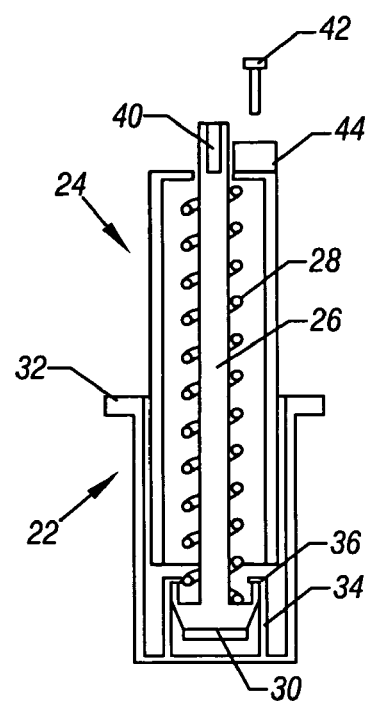
FIG. 12 is a vertical cross-sectional view illustrating the disassembly technique in accordance with one embodiment of the present invention.
Figure 13:
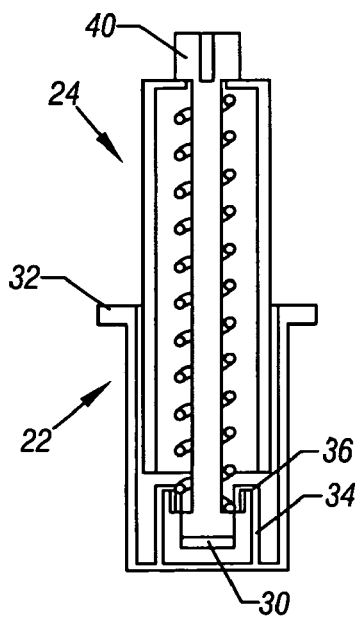
FIG. 13 is a cross-sectional view corresponding to FIG. 12 and illustrating a subsequent step in the disassembly process in accordance with one embodiment of the present invention.
Figure 14:
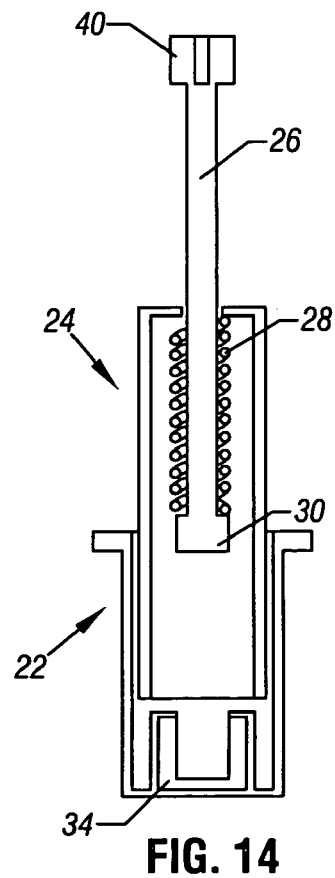
FIG. 14 is a vertical cross-sectional view corresponding to FIG. 13 at a subsequent stage of disassembly in accordance with one embodiment of the present invention.

The disassembly process, illustrated in FIGS. 12 through 14, enables the heat sink assembly 10 to be removed from the board 12. To this end, as shown in FIG. 12, the bolt 42 is unfastened from the block 44. As a result, the block 44 may be removed. This enables the operator 40 to be rotated 90 degrees, which rotation was otherwise prevented by the imposition of the block 44. Once the operator 40 can be turned, the rod 26 may be turned, causing the base 30 to turn. The rotation of the base 30 frees the base 30 from the overlying catches 36 and allows the rod 40 to be pulled upwardly.

As shown in FIG. 13, the base 30 rotates free of the catch 34 due to the rotation of the operator 40. Then, as shown in FIG. 14, the rod 26, engaged by the operator 40, can be lifted upwardly. This action compresses the spring 28. At this point, if four elements 16 are provided and operated at the same time, all that is needed is to simply pull the heat sink 14 away from the printed circuit board 12.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for releasably plugging a heat sink assembly into a printed circuit board comprising:
   connecting an upper portion of a releasable plug to a heat sink;
   connecting a lower portion of said releasable plug into said printed circuit board; and
   releasably telescopically plugging said upper portion of said assembly into said lower portion of said assembly.

2. The method of claim 1 including enabling said lower portion to plug into a hole in the printed circuit board.

3. The method of claim 1 including enabling a spring biased rod in said upper portion to engage a catch on said lower portion.

4. The method of claim 3 including enabling said catch to be released by rotating said rod.

5. The method of claim 4 including providing a way to prevent rotation of said rod.

6. The method of claim 5 including providing a flanged end on said rod to engage a releasable lock to prevent rotation of said rod.

7. The method of claim 6 including providing an extending end on said rod opposite said flanged end of said rod to engage said catch and to be released from said catch when said rod is rotated.

8. A heat sink assembly comprising:
   a telescoping first portion to engage a printed circuit board;
   a telescoping second portion to engage a heat sink to be attached to said printed circuit board;
   said first portion and said second portion releasably locking together when said first portion is plugged into said second portion;
   wherein said first portion includes a cammed member that deflects inwardly into said first portion when said first portion engages a printed circuit board and snaps outwardly after said first portion is plugged into said printed circuit board, releasably holding said first portion in said printed circuit board; and
   wherein said first portion includes a pair of opposed L-shaped catch members, said first portion is cylindrical having a closed end and an open end, said open end to receive said second portion, said closed end mounting said catches.

9. The assembly of claim 8 wherein said second portion includes a tubular member that slides within said first portion.

10. The assembly of claim 9 wherein said tubular member includes threads to threadedly secure said second portion to a heat sink.

11. The assembly of claim 9 including a rod reciprocatable within said tubular member, said rod having opposed ends, one of said ends to engage the catches in said first portion.

12. The assembly of claim 11 wherein said rod is spring biased.

13. The assembly of claim 11 wherein the free end of said rod to releasably engage said catches and to be releasable upon rotation of said rod.

14. The assembly of claim 13 wherein the upper surface of said tubular member of said second portion includes a locking member to prevent rotation of said rod to release said free end of said rod from said catch in said first portion.

15. The assembly of claim 8 including a heat sink secured to said second portion.

16. The assembly of claim 15 including a printed circuit board secured to said first portion.

17. A heat sink assembly comprising:
   a telescoping first portion to engage a printed circuit board;
   a telescoping second portion to engage a heat sink to be attached to said printed circuit board;
   said first portion and said second portion releasably locking together when said first portion is plugged into said second portion;
   wherein said second portion includes a tubular member that slides within said first portion; and
   wherein said tubular member includes threads to threadedly secure said second portion to a heat sink.

18. The assembly of claim 17 including a rod reciprocatable within said tubular member, said rod having opposed ends, one of said ends to engage the catches in said first portion.

19. The assembly of claim 18 wherein said rod is spring biased.

20. The assembly of claim 18 wherein the free end of said rod to releasably engage said catches and to be releasable upon rotation of said rod.

21. The assembly of claim 20 wherein the upper surface of said tubular member of said second portion includes a locking member to prevent rotation of said rod to release said free end of said rod from said catch in said first portion.

* * * * *